United States Patent [19]

Huenemann et al.

[11] Patent Number: 4,995,006

[45] Date of Patent: Feb. 19, 1991

[54] APPARATUS AND METHOD FOR LOW-PASS EQUIVALENT PROCESSING

[75] Inventors: Robert G. Huenemann, Hollister; Frederick J. Harris, Lemon Grove, both of Calif.

[73] Assignee: Wiltron Company, Morgan Hill, Calif.

[21] Appl. No.: 175,762

[22] Filed: Mar. 31, 1988

[51] Int. Cl.$^5$ .......................................... G01R 23/177
[52] U.S. Cl. .................... 364/485; 364/487; 364/571.02; 364/726; 364/827; 324/77 B; 324/77 R; 324/650; 375/10
[58] Field of Search ............... 364/482, 484, 485, 487, 364/553, 571.01, 571.02, 571.04, 572, 576, 580, 726, 827; 324/58 A, 58 B, 58.5 A, 58.5 B, 77 B, 77 R; 375/10, 82, 122

[56] References Cited

U.S. PATENT DOCUMENTS

| | | | |
|---|---|---|---|
| 3,803,395 | 4/1974 | Quate | 364/827 |
| 4,282,579 | 8/1981 | Speiser et al. | 364/827 |
| 4,644,268 | 2/1987 | Malka et al. | 324/77 B |
| 4,680,538 | 7/1987 | Dalman et al. | 324/58 A |
| 4,703,433 | 10/1987 | Sharrit | 364/485 |
| 4,713,782 | 12/1987 | Blackham | 364/726 |
| 4,730,257 | 3/1988 | Szeto | 324/77 B |
| 4,766,386 | 8/1988 | Oliver et al. | 324/58.5 B |
| 4,812,738 | 3/1989 | Itaya et al. | 324/58 B |
| 4,816,767 | 3/1989 | Cannon et al. | 324/77 B |

Primary Examiner—Gary Chin
Assistant Examiner—V. N. Trans
Attorney, Agent, or Firm—Fliesler, Dubb, Meyer & Lovejoy

[57] ABSTRACT

Low pass equivalent processing is a method for use with a network analyzer, that gethers a sequence of NDATA samples, each sample including real and imaginary components of a signal, over a frequency range from F1 to f2 in frequency steps of (f2−f1)/(NDATA-1), where f1 is greater than zero. The sequence of samples is processed to estimate a characteristic of the signal with respect to a selected discontinuity in the signal. The sequence of samples is converted to time domain, to generate time domain data over a range from zero to t. The selected discontinuity is identified as lying within a range of t1 to t2. Next, the phase of the time domain data is unwound to correct a portion of the phase error resulting from the one sided spectrum that is not dependent on the distance to the discontinuity through the network. Next, the magnitude peak JMAX of the data samples between time range t1 to t2, is determined. The phase angles of the data at two points removed from the magnitude JMAX by a number of data points dependent on the type of biasing window used in measurement of the data are used to determine a slope through JMAX. From this information, an estimate is made of the location of the discontinuity in the network. The phase of the time domain data is unwrapped in response to that estimate of location according to an empirically derived equation.

22 Claims, 7 Drawing Sheets

REAL AND IMAGINARY PARTS          LINEAR POLAR PLOTS

R=49.0099 OHMS

L=0
C=0

R=50.00 OHMS

L=0
C=0

R=51.0101 OHMS

L=0
C=0

APPARATUS AND METHOD FOR LOW-PASS EQUIVALENT PROCESSING

LIMITED COPYRIGHT WAIVER

A portion of this patent document, contains material to which a claim of copyright protection is made. The copyright owner has no objection to the facsimile reproduction by anyone of the patent document, or the patent disclosure as it appears in the U.S. Patent and Trademark Office patent file records, but reserves all other rights whatsoever.

CROSS-REFERENCE TO RELATED APPLICATION

The present invention is related to copending U.S. patent application Ser. No. 07/176,202 entitled MICROWAVE MEASUREMENT SYSTEM AND ASSOCIATED METHOD, invented by Martin I. Grace et al., filed on the same date as the present application, and owned currently and at the time of invention by a common assignee, and is incorporated by reference herein.

BACKGROUND OF THE INVENTION

1. Field of the Invention

The present invention relates to electronic network analysis, and more particularly, to methods and apparatus for processing data samples indicating the transmission or reflection characteristics of an electronic network.

2. Description of Related Art

Network analyzers, such as the WILTRON 360, available through WILTRON, 490 Jarvis Drive, Morgan Hill, Calif. 95037, measure the real and imaginary components of the reflection and transmission coefficients of a network over a range of equally-spaced frequencies between operator-delivered frequencies f1 and f2. The analyzer will display the results of the measurements in a real and imaginary format, or they can be converted to magnitude and phase and displayed in a variety of graph types for the user's convenience. One technique, which has proven useful in practice, for analyzing the measurements, involves taking the data measured in a frequency domain and converting it to the time domain by means of an inverse Fourier transform. The Fourier transform will give the response of the network in the time domain. With time domain data, the results of the measurements can be used to determine distances in the network to discontinuities reflected in the data, because time is directly related to distance through the network by the velocity of propagation of the signals through the network. Therefore, this technique is useful for analyzing complex electronic networks in order to isolate discontinuities.

If only the magnitudes and locations of various discontinuities are to be determined, it is then a simple matter to transform the frequency domain data exactly as it is measured. However, it is possible to increase the utility of the time domain data by performing additional processing steps to identify correct phase measurements for the data.

In the prior art, a true low-pass algorithm has been utilized to construct the additional time domain data reflecting accurate phase information. However, for the true low-pass algorithm, f1 must be zero. The algorithm works by constructing a complete double-sided spectrum from $-f2$ to $f2$ by taking the complex conjugate of the data at each positive frequency and placing it at the corresponding negative frequency as shown below.

| DATA FROM MEASUREMENT | | | | | | | |
|---|---|---|---|---|---|---|---|
| 0 | | | | | | f2 | FREQUENCY DOMAIN |
| | x1 | x2 | x3 | ... | xn | | (real part of data) |
| | 0 | y2 | y3 | ... | yn | | (imaginary part) |
| CONSTRUCTED COMPLEX CONJUGATE SPECTRUM | | | | | | | |
| $-f2$ | | | 0 | | | f2 | FREQUENCY DOMAIN |
| xn ... x3 | x2 | x1 | x2 | x3 | ... | xn | (real part) |
| $-yn$ ... $-y3$ | $-y2$ | 0 | y2 | y3 | ... | yn | (imaginary part) |

The inverse Fourier transform of the constructed complex conjugate spectrum is real, that is, the imaginary part is zero for all data samples as shown below.

| 0 | | | | t | TIME DOMAIN |
|---|---|---|---|---|---|
| x1 | x2 | x3 | ... | | (real part) |
| 0 | 0 | 0 | ... | | (imaginary part) |

From the real part of the transform, it is possible to deduce not only the magnitude of the network discontinuities, but their nature. If the discontinuity consists of a change in impedance, that fact can be recognized and an increase of impedance can be distinguished from a decrease. If a discontinuity is reactive, it can be identified as inductive or capacitive. The location of each discontinuity can be determined within the resolution limits of the measurement.

This true low pass method has been used for a number of years. However, it is subject to the constraint that the measured data must be available with the entire spectrum down to zero frequency (f1 must be zero). If the reflection of interest is from a narrow band circuit, such as a filter or wave guide, the true low pass method cannot be used. Further, for equipment that is incapable of providing equal frequency steps all the way down to zero frequency, the true low pass method is unavailable.

Thus, in the more general case, f1 is not zero. The missing information from the unmeasured part of the spectrum between zero frequency and f1, causes a distortion in the time domain response.

Another source of distortion is the phase rotation in the time domain which is an unavoidable consequence of transforming a single sided spectrum. The arbitrary phase rotation which appears in this case makes it impossible, using prior art techniques, to determine the nature of the discontinuity at a given distance.

Accordingly, there is a need for apparatus and methods for processing data measured over a range of frequencies from f1 to f2 where f1 is greater than zero. In particular, it is desirable to identify accurate phase information for data samples of interest in the time domain where the complete complex conjugate spectrum is unavailable.

SUMMARY OF THE INVENTION

The present invention, providing an apparatus and method for low pass equivalent processing, reduces the difficulty of interpreting time domain information constructed from an inverse Discrete Fourier Transform over a single sided spectrum.

According to one aspect, the present invention is a method for use with a network analyzer that gathers a sequence of NDATA samples, each sample including real and imaginary components of a signal, over a frequency range from f1 to f2 in equal frequency steps, where f1 is greater than zero. The method processes the sequence of samples to estimate a characteristic of the signal with respect to a selected discontinuity in the signal. The sequence of samples is converted to time domain, to generate a sequence of time domain samples over a range from zero to t. The selected discontinuity is identified as lying within a range of t1 to t2. Then the phase of the time domain data is unwound to correct a portion of the phase error resulting from the one sided spectrum that is not dependent on the distance to the discontinuity through the network. Next, an estimate of the location of the discontinuity in the first corrected time domain data is generated. The phase of the time domain data is unwrapped in response to that estimate of location. Finally the resulting data is displayed.

The data resulting after the above processing have consistent real and imaginary parts which can be interpreted in terms of the nature of the discontinuity. The interpretation will be somewhat different from that of true low pass data. The real part will be positive or negative if there is an increase or decrease in impedance, respectively. The imaginary part will be positive or negative if there is an inductive or capacitive reactance, respectively.

According to another aspect, the present invention is an apparatus for performing the low pass equivalent processing outlined above and for displaying the results to a user.

Other aspects and advantages of the present invention can be determined from a study of the following description of the preferred embodiment, the figures and the claims.

DESCRIPTION OF THE PREFERRED EMBODIMENT

Figure 1:
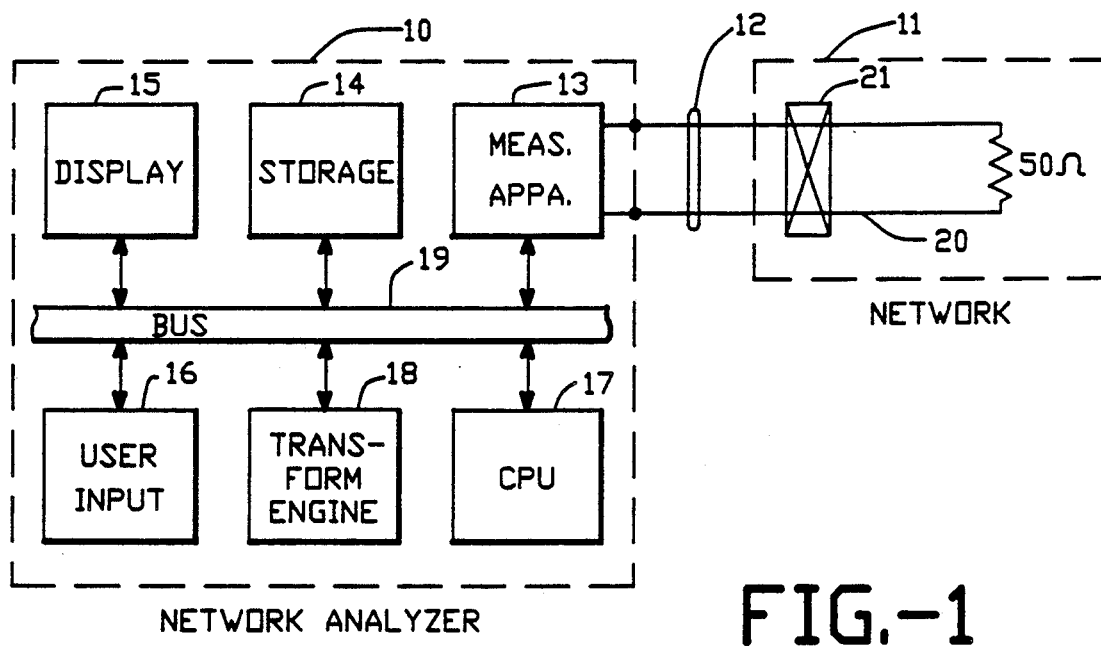
FIG. 1 is a block diagram of the apparatus according to the present invention.

The detailed description of a preferred embodiment of the present invention is described with reference to the figures. FIG. 1 provides a system overview. FIGS. 2A-2D, 3A-3D and 4A-4I are graphs illustrating characteristics of the data samples before and after processing according to the present invention. FIG. 5 is a flowchart illustrating the processing according to the present invention.

The present invention has been incorporated into a network analyzer called the WILTRON 360, manufactured by WILTRON, 490 Jarvis Drive, Morgan Hill, Calif. 95037. This system is described in detail in the co-pending U.S. patent application entitled MICROWAVE MEASUREMENT SYSTEM AND ASSOCIATED METHOD referred to above.

FIG. 1 schematically illustrates a system of the present invention set up for a typical reflection characteristic measurement. The system includes a network analyzer 10 and a network 11 coupled to the analyzer across input lines 12. The network analyzer 10 includes measurement apparatus 13, a storage facility 14, a display 15, a user input interface 16, a central processing unit 17 and a transform engine 18, all coupled to bus 19 for communication.

The measurement apparatus 13 samples the reflection or transmission characteristics under control of the CPU 17 across a frequency spectrum from f1 to f2 and stores the measured data samples into the storage 14. The CPU processes the stored data for display according to a variety of formats as desired by the user. The user communicates with the CPU 17 through a user input interface 16 consisting of a plurality of control switches and a keyboard. Associated with the CPU is a discrete Fourier Transform (DFT) engine 18 which is utilized for transforming the information taken in the frequency domain to the time domain. In the preferred system, the transform engine is a software utility which performs the chirp Z-transform as described below with respect to the preferred embodiment. The chirp Z-transform is described in detail in L. R. Rabiner, "Chirp Z-Transform Algorithm Program", *Programs for Digital Signal Processing*, IEEE Press, New York, N.Y., 1979, pp. 1.6-1 to 1.6-13.

The network 11 in FIG. 1 consists of a transmission line 20, having a characteristic impedance of 50 ohms. Along the transmission line 20, a discontinuity 21 exists. The nature of the discontinuity can be a step-up in impedance, a step-down in impedance, capacitive, inductive, or a combination of these characteristics.

The user of the network analyzer 10 desires to determine the location of the discontinuity 21 along the transmission line 20 as well as its nature. Thus, the user sets up the measurement apparatus 13 through the CPU 17 to take measurements over a range of equally spaced frequencies from frequency f1 to frequency f2. The analyzer samples the real and imaginary components of the reflection coefficient at each frequency. Results can be displayed in a real and imaginary format, or they can be converted to magnitude and phase for user convenience.

FIGS. 2A-2D and 3A-3D illustrate the stages of data processing according to the present invention for a simple short circuit discontinuity with a rectangular window (FIGS. 2A-2D), or a two-term Hamming window (FIGS. 3A-3D). Each of FIGS. 2A-2D and 3A-3D includes plots of the real and imaginary components of the data and a polar plot with the same data.

Figure 2A:
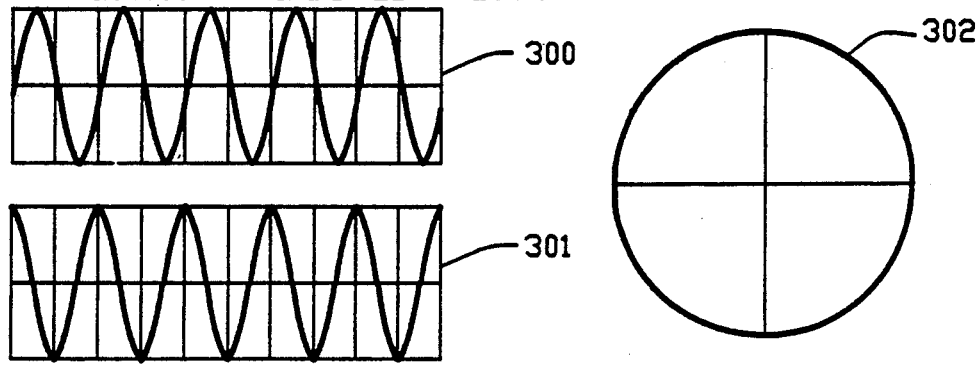
FIGS. 2A-2D are charts illustrating processing of the measured data samples with a rectangular window according to the present invention.
Figure 2B:
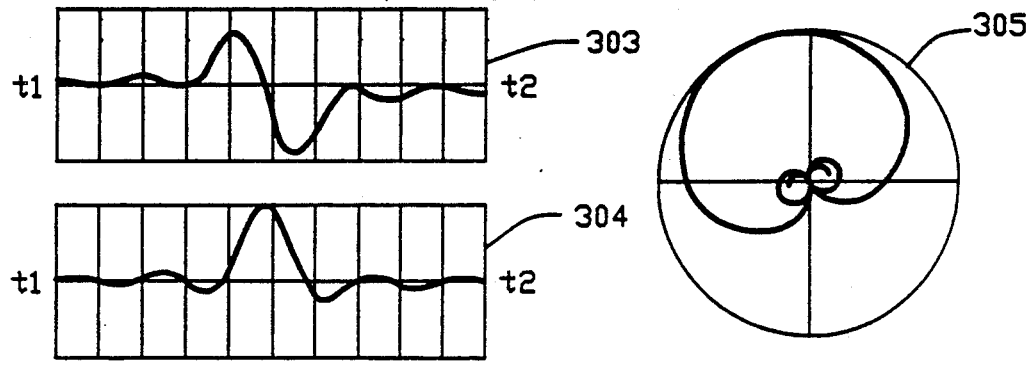

FIG. 2A illustrates the windowed frequency domain data with a rectangular window. The real component is illustrated in chart 300, the imaginary component in chart 301 and the polar graph is shown in chart 302. As can be seen, it is simply a constant magnitude signal with a phase rotating around 360 degrees. After transforming the single-sided spectrum, the data from point t1 to point t2 takes the form shown in FIG. 2B, with the real component shown in chart 303, the imaginary component shown in chart 304 and the polar magnitude plot shown in chart 305. The portion of the time domain data shown in FIG. 2B is those data points taken around the main lobe of the discontinuity of interest as selected by a user through the keyboard interface. This does not illustrate the entire range from 0 to t which could be generated by the transform. As is illustrated in the chart 305, the phase information is quite difficult to decipher.

Figure 2C:
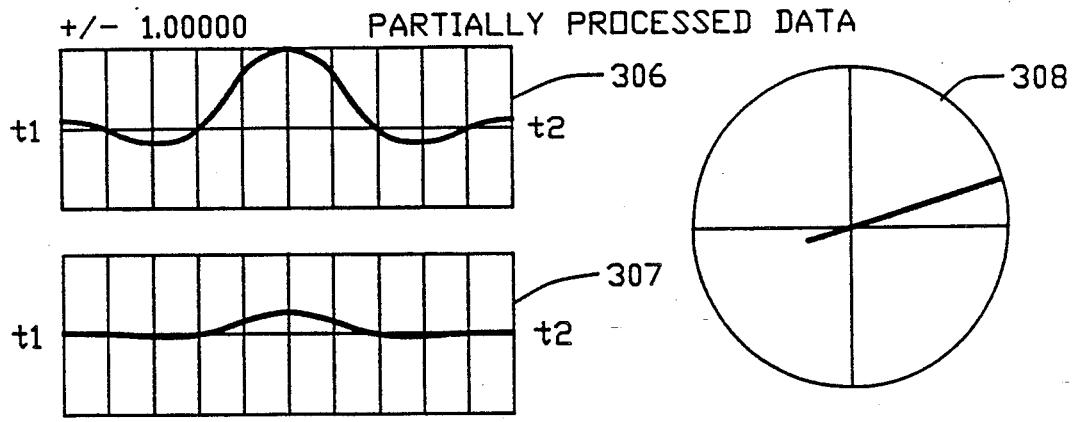
Figure 2D:
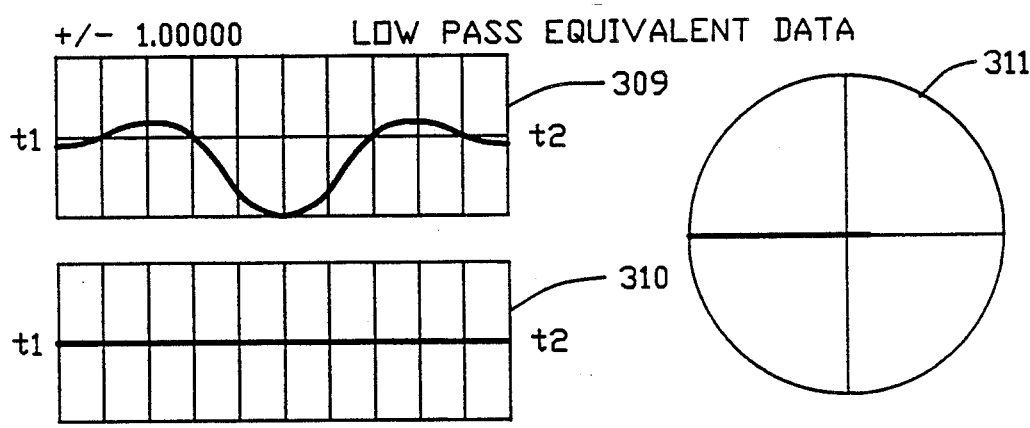

FIG. 2C illustrates the partially processed time domain data from point t1 to point t2 after removing the portion of the phase error that is not dependent on the distance to the discontinuity through the network. The real component is shown in chart 306, the imaginary component in chart 307 and the polar plot in chart 308. As can be seen, the phase information in the data is now normalized to a simple line in the polar plot. However, this includes an error that is dependent on the particular location of the discontinuity in the network. In the final unwinding step, that error is removed and the resulting data is shown in FIG. 2D. The real component of the resulting data is shown in chart 309, the imaginary component in chart 310 and the polar plot in chart 311. This takes the form that would be expected for a simple short circuit discontinuity in the network. The imaginary part is zero everywhere as shown at chart 310. The polar plot takes the form of a vector with a phase of minus 180 degrees illustrating a step-down in impedance with no reactive component.

Figure 3A:
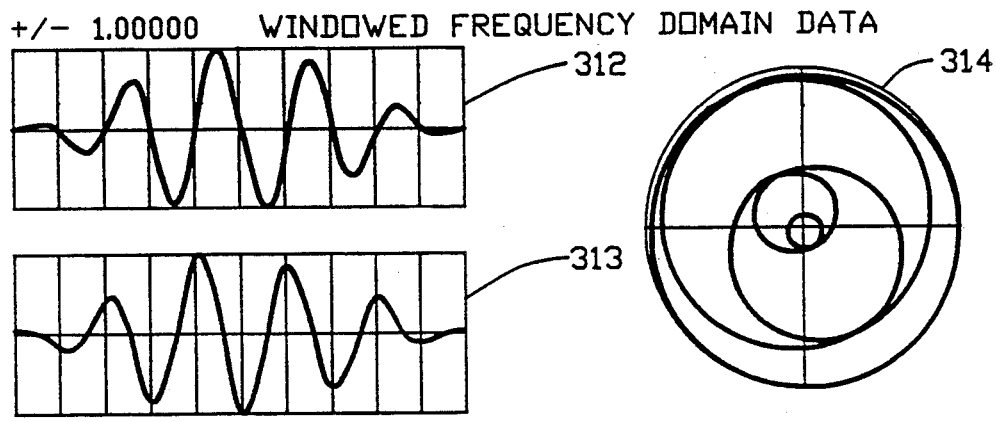
FIGS. 3A-3D are charts illustrating processing of the measured data samples with a Hamming window according to the present invention.
Figure 3B:
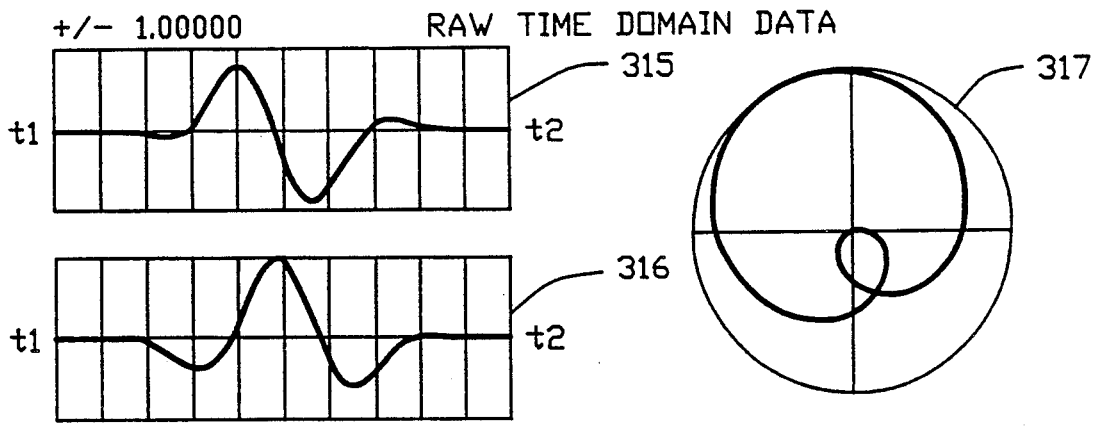
Figure 3C:
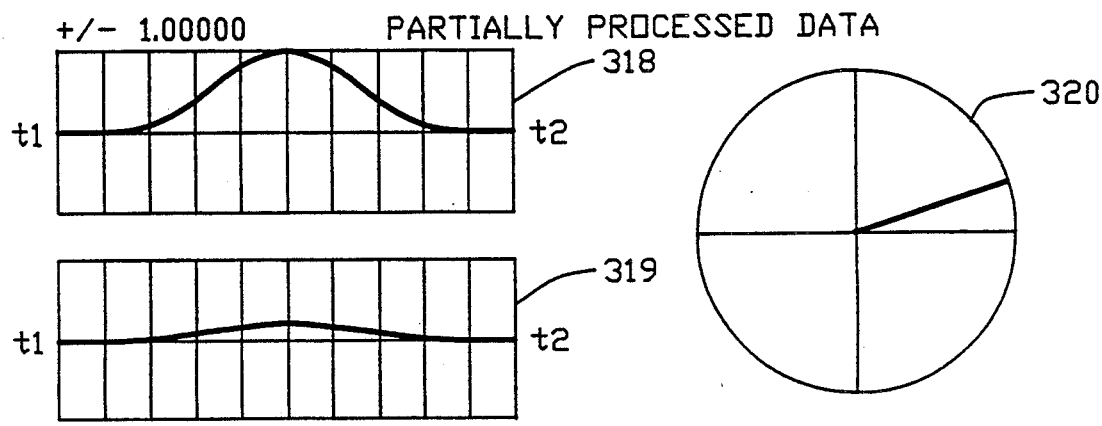
Figure 3D:
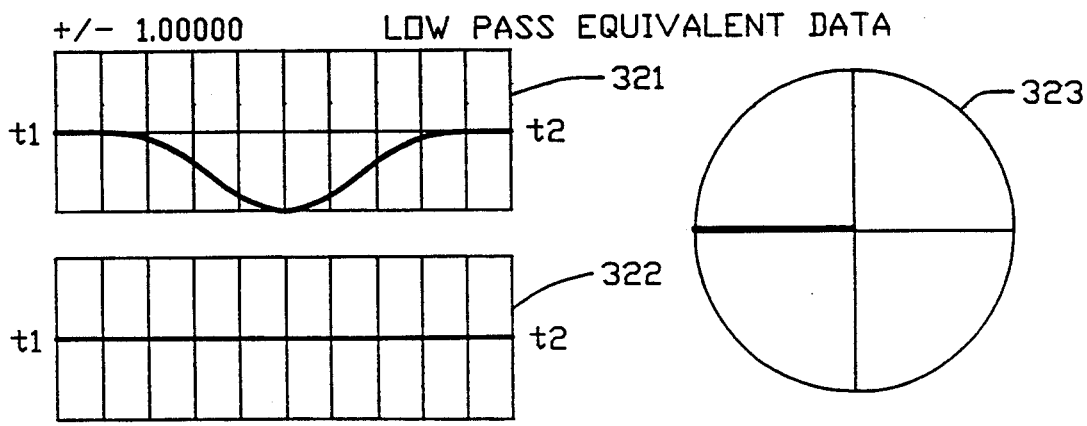

FIGS. 3A-3D illustrate the same data using a two-term Hamming window in order to improve the displayed characteristics for the purposes of analysis. Accordingly, FIG. 3A shows the real and imaginary components of the frequency domain data in charts 312 and 313, respectively. The polar plot is shown in chart 314. The raw time domain data real and imaginary components between points t1 and t2 which illustrate the main lobe of the discontinuity are shown in charts 315 and 316 of FIG. 3B. The polar plot of the raw time domain data is shown in chart 317 of FIG. 3B. After removing a portion of the phase error that is independent of the distance to the discontinuity, the time domain data as partially processed, is shown in FIG. 3C. The real component of the partially processed data is shown in chart 318, the imaginary component in chart 319 and the polar plot in chart 320. After the final unwinding, removing the portion of the phase error that is dependent upon the location of the discontinuity in the network, the low pass equivalent data according to the present invention, is shown in FIG. 3D, with the real component shown in chart 321, the imaginary component in chart 322 and the polar plot shown in chart 323. As can be seen, this is an improved version of the processed data over that shown in FIG. 2D because of the Hamming window. The real component is below zero across the entire discontinuity, the imaginary component is zero everywhere. Thus, the polar plot is the form of a vector from zero to minus one as illustrated in chart 323. Again, this is the form of a polar plot that would be expected for a simple short circuit discontinuity in the network. The expected characteristics of time domain data for various discontinuities are illustrated in FIGS. 4A-4I.

FIGS. 4A-4I are plots illustrating time domain data after correction according to the present invention. Graphs 4A, 4B and 4C are plots in the time domain of corrected data for a discontinuity which is a step-down in impedance (R=49.0099 ohms), no discontinuity (R=50.00 ohms), and for a discontinuity which is a step-up in impedance (R=50.0101 ohms) with no reactive components (L=0, C=0).

Figure 4A:
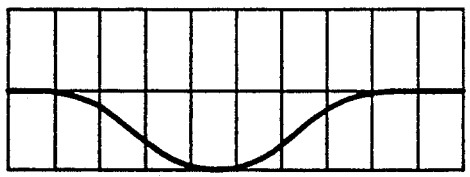
FIGS. 4A-4I are samples of the data samples for various discontinuity types after processing according to the present invention.
Figure 4A:
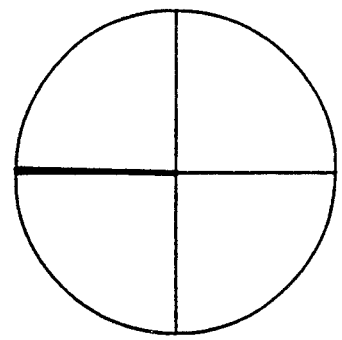
Figure 4B:
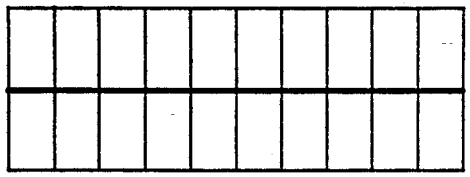
Figure 4B:
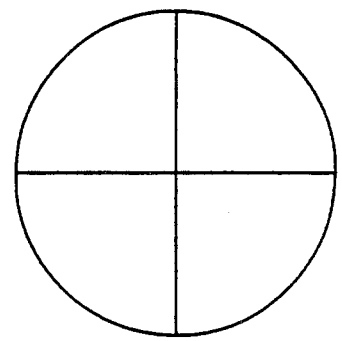
Figure 4C:
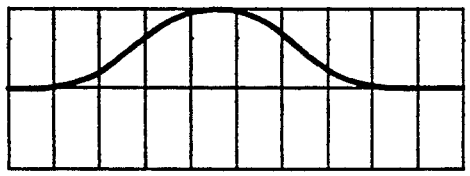
Figure 4C:
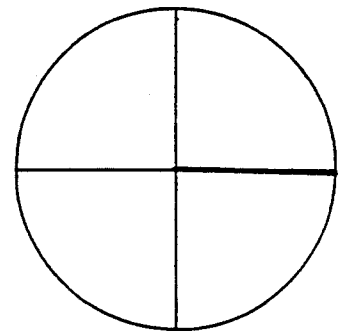
Figure 4D:
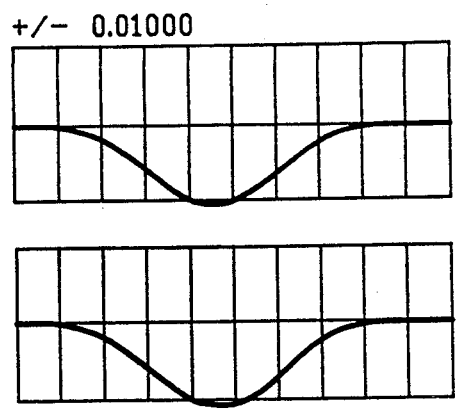
Figure 4D:
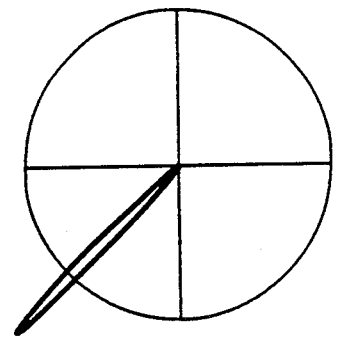
Figure 4E:
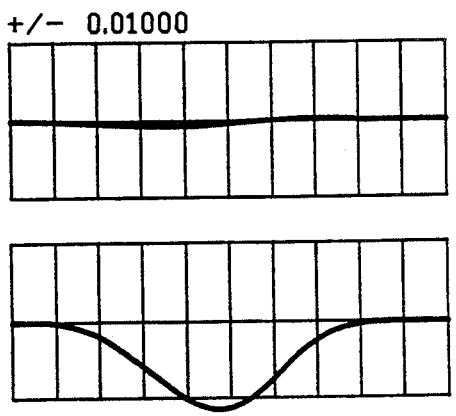
Figure 4E:
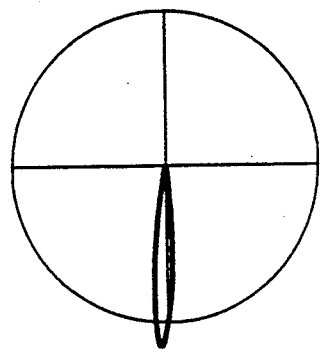
Figure 4F:
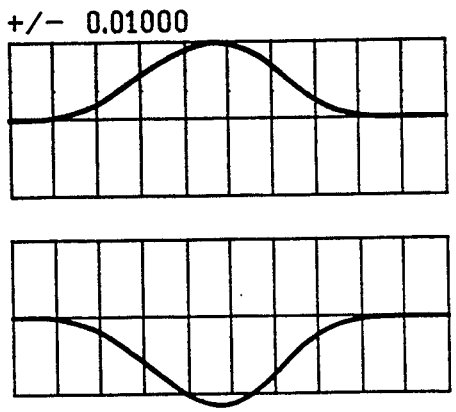
Figure 4F:
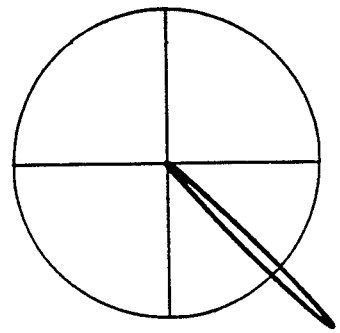
Figure 5:
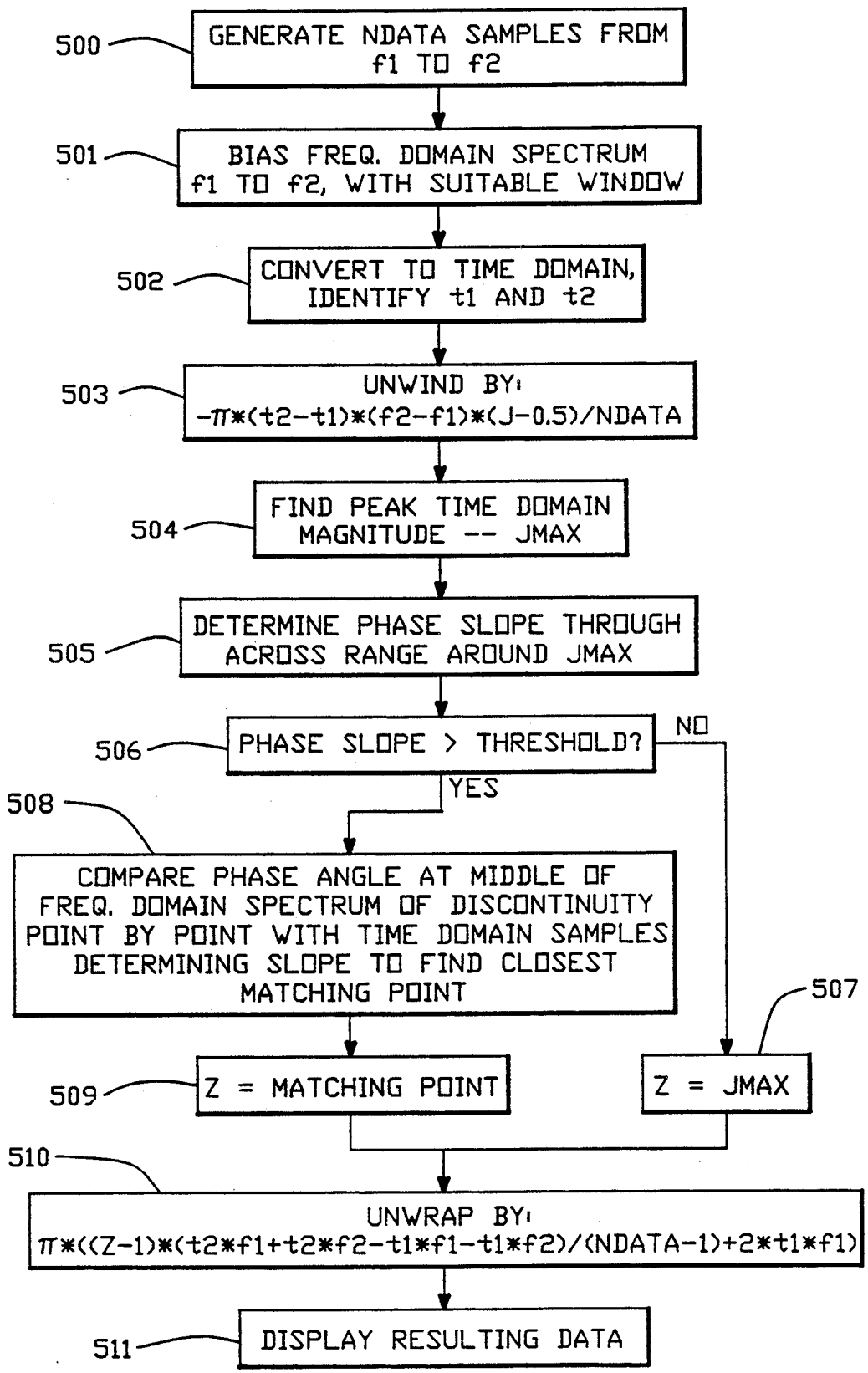
FIG. 5 is a flowchart illustrating the process of the present invention.

FIGS. 4D, 4E and 4F are plots of the real and imaginary components of the corrected time domain data for a capacitive discontinuity (C=0.0032 pF) across a frequency range of 18 to 26.5 GHz with step-down in impedance, no impedance change, and a step-up in impedance, respectively.

Figure 4G:
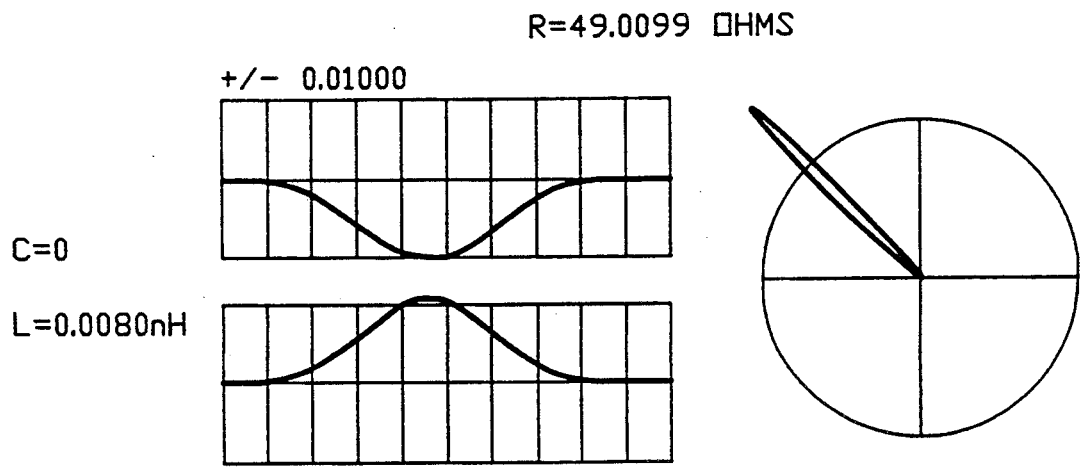
Figure 4H:
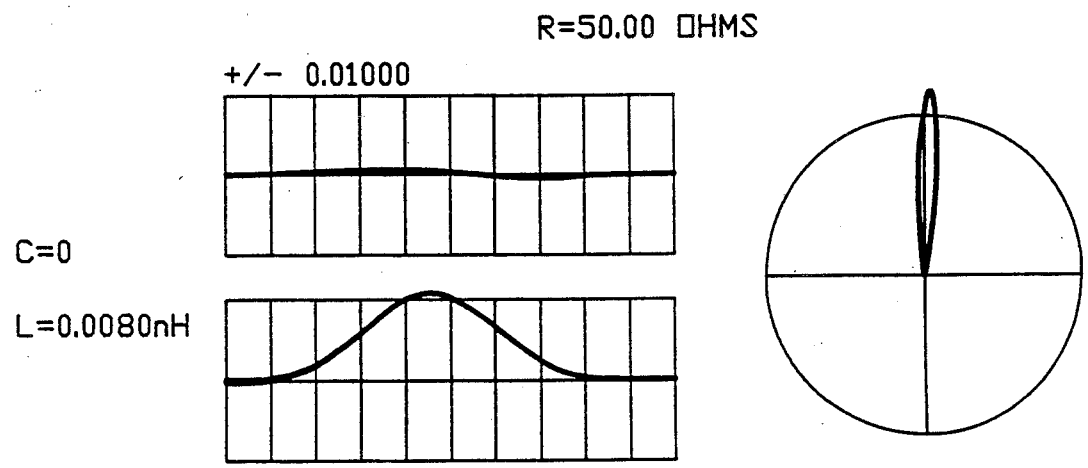
Figure 4I:
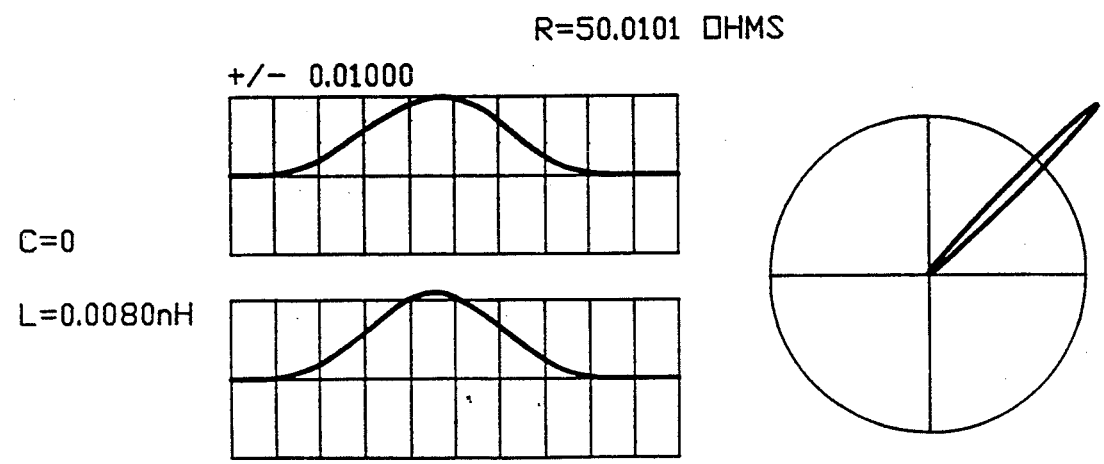

FIGS. 4G-4I illustrate the real and imaginary components of the corrected time domain data for an inductive discontinuity (L=0.0080 mH) across a frequency range of 18 to 26.5 GHz with step-down, no change, and a step-up in impedance, respectively.

Using the location of the main lobe of the discontinuity as well as the plots as illustrated in FIGS. 4A-4I, a great deal of information about the nature of the discontinuity and its location can be determined. Of course for complex discontinuities that involve combinations of reactive and non-reactive components, the shapes of these plots may vary widely. Also, the plots shown in FIGS. 4A-4I were generated using a Hamming window with two terms as a bias to the time domain data. The Hamming window is used to enhance the characteristics of the discontinuity so that plots as illustrated in FIGS. 4A-4I are more readily readable. The present invention will work with or without biasing windows.

Let us diagram the frequency domain measurement, the transformed time domain data and their relationships. The frequency domain is shown below:

| 0 | f1 | | | f2 | FREQUENCY DOMAIN |
|---|----|----|----|----|----|
| | x1 | x2 | x3 | ... xn | (real part of data) |
| | y1 | y2 | y3 | ... yn | (imaginary part) |

The inverse Fourier transform can be used to obtain n complex points of independent data in the time domain, as shown below:

| 0 | t1 | | t2 | t | TIME DOMAIN |
|---|----|----|----|---|----|
| | x1 | x2 | x2 | ... xn | (real part of data) |
| | y1 | y2 | y3 | ... yn | (imaginary part) |

The time domain covers a range from 0 to t, after which it repeats indefinitely. This behavior is called aliasing. The range t is the inverse of the frequency domain step size:

$$t = (NDATA - 1)/(f2 - f1).$$

The time domain step size $t/(NDATA-1)$ is the inverse of the frequency domain range:

$$t/(NDATA-1) = 1/(f2-f1).$$

In the preferred embodiment, the chirp Z-transform is used to display the arbitrary time range from t1 (starttime) to t2 (endtime) indicated in the last figure. Other DFT algorithms can be employed if desired. The number of equally spaced points calculated for this range t1 to t2 is equal to the number of points in the frequency domain, although the chirp Z-transform does allow the number of input and output points to differ. Note that the chirp Z-transform performs a band limited interpolation because t1 to t2 is less than the unaliased time range 0 to t.

The chirp Z-transform as published by the IEEE uses certain conventions which will be adopted here, for the parameters used in calling the transform. The published algorithm is nominally a forward transform. Converting it to an inverse transform can be accomplished by reversing the rotation of the output data, which can be done by using negative values for the parameters DLTOMG and OME0. In addition, NDATA and NOPTS are set to a common integer value and FS is set to the same value, using a floating point variable to satisfy the variable type requirements of FORTRAN, the language in which the chirp Z-transform is written.

Phase rotation of complex data is accomplished by doing a complex multiplication of the data by a unit vector with an angle equal to the desired change in radians. Where array index values are specified, they fall in the range of 1 to NDATA. This is the FORTRAN indexing convention.

When the foregoing conventions are followed, the low pass equivalent algorithm can be expressed as shown in FIG. 5. First, the system generates the NDATA data samples in a frequency range from f1 to f2 (block 500). The routine processes the samples as follows:

1. Apply a suitable window to the frequency domain data with NTERMS terms (block 501). A Hamming raised cosine window with two terms (NTERM=2) is found to provide useful results for many measurements. Also, 3 or 4 term raised cosine windows, known as Blackman windows, can be used. For information concerning selection of windows, see F. J. Harris, "On the Use of Windows for Harmonic Analysis with the Discrete Fourier Transform", *Proc. IEEE*, Vol 66, no. 1, pp. 51-83, January 1978. Biasing with Hamming windows is not necessary for all measurements, but can aid interpretation of the data. A "rectangular" window (NTERMS=1) is suitable for many measurements.

2. Convert data to the time domain with the chirp Z-transform, selecting DLTOMG and OME0 as shown, so that the main lobe of the discontinuity from t1 to t2 (block 502), fills the display of time domain data.

$$DLTOMG = -(t2-t1)*(f2-f1)/(NDATA-1)$$

$$OME0 = -(f2-f1)*(t1+(t2+t1)/(2*NDATA-2))$$

3. Unwind the phase of the time domain data by an amount given by $$-pi*(t2-t1)*(f2-f1)*(J-0.5)/NDATA$$

where J is the index into the time domain data (block 503). This corrects the portion of the phase error which is not dependent on the distance to the discontinuity.

4. Find the magnitude peak JMAX of the displayed time range t1 to t2 (block 504). Find the phase angles of the data at two points removed from the magnitude peak by a number of data points equal to the integer part of $$NTERMS*(NDATA-1)/(2*(t2-t1)*(f2-f1))$$

where NTERMS is the number of terms in the window used (block 505). NTERMS reflects the width of the main lobe relative to its width for a rectangular window. Determine the difference in phase angle at these two data points to identify the phase slope through JMAX.

5. Compare this phase difference to a threshold value determined by experiment for the particular instrument configuration (block 506). If the difference, or phase slope, is less than the threshold value, the discontinuity is not reactive, branch to block 507.

6. If the phase slope exceeds the threshold value, JMAX is not the best estimate of the location of the discontinuity, branch to block 508. An improved estimate is generated by comparing the phase at the middle of the spectrum of the discontinuity with the phase of the time domain data over which the phase slope was determined in block 505.

The processing performed in step 3 (block 503) is a heterodyne operation in the time domain. It is the equivalent of a shift in the frequency domain of the middle of the spectrum of the discontinuity to zero frequency. The spectral component of interest can be computed with a discrete Fourier transform. Since the component is at zero frequency, the transform degenerates into a simple summation of the real and imaginary parts of the data. The inverse tangent operation is then used to find the angle of interest.

Once the angle has been found, it is compared point by point with the angles of the time domain data between t1 and t2 until the best match is found. Linear interpolation can be used to find the point of match between the closest two data points, if desired. This matching point is an improved estimate of the location of the discontinuity.

Alternative methods for estimating the location may be derived for a particular application.

7. The estimate of location determined in block 505 or block 508 is set as variable Z with a value between 1 and NDATA in blocks 507 and 509, respectively. Z is used to do a final unwrapping of the phase of the time domain data (block 510), using a phase value given by $$pi*((Z-1)*(t2*f1+t2*f2-t1*f1-t1*f2)/(-NDATA-1)+2*t1*f1)$$

8. Finally, the resulting data is displayed (block 511). The data will now have consistent real and imaginary parts which can be interpreted in terms of the nature of the discontinuity as illustrated in FIGS. 4A-4I. The interpretation will be somewhat different from that for true low pass data. The real part will be positive or negative if there is an increase or decrease in impedance. The imaginary part will be positive or negative if there is an inductive or capacitive reactance. Combined discontinuities will exhibit combined effects.

Source code in FORTRAN implementing a preferred embodiment of the present invention is provided as an appendix to the present application.

CONCLUSION

The present invention provides low pass equivalent processing useful in analyzing data sampled from a complex network. Users of the present invention will be able to better identify discontinuities in networks for design and trouble shooting tasks.

It has been established that according to the present invention, frequency domain data taking over a range of frequencies from f1 to f2, where f1 is not equal to zero, can be transformed to the time domain and the phase information for a particular point in that time domain data can be reconstructed with an accuracy that is useful for analyzing characteristics of the network from which the frequency domain samples were taken. Results may not be obtainable for all networks.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. A method for generating data used for analyzing a network, comprising the steps of:
    supplying excitation signals to the network at frequencies in a range from f1 to f2;
    measuring and recording a plurality of frequency domain samples of a signal generated by the network in response to the excitation signals;
    converting the frequency domain samples to a plurality of time domain samples within a range from t1 to t2, wherein a selected discontinuity is located between t1 and t2;
    correcting phase errors in the plurality of time domain samples independent of location of the selected discontinuity;
    estimating the location of the selected discontinuity in the first corrected time domain samples;
    identifying a time domain sample closet to the estimated location from the plurality of time domain samples;
    correcting phase errors in the time domain sample closest to the estimated location to generate resulting data; and
    displaying the resulting data.

2. The method of claim 1, wherein the steps of converting, first correcting, estimating, and second correcting are implemented by software control of a data processing unit.

3. The method of claim 1, wherein the step of converting includes calculating an inverse chirp Z-transform to generate the plurality of time domain samples.

4. The apparatus of claim 1, wherein the first step of correcting includes shifting the plurality of time domain samples in phase by an amount V given by $$V = -pi*(t2-t1)*(f2-f1)*(j-0.5)/NDATA;$$

where NDATA is the number of samples in the plurality of time domain samples between t1 and t2.

5. The apparatus of claim 1, wherein the second step of correcting includes shifting the time domain sample closest to the estimated location by an amount U given by $$U = pi*(Z-1)*(t2*f1+t2*f2-t1*f1-t1*f2)/(-NDATA-1)+2*t1*f1);$$

where NDATA is the number of samples in the plurality of time domain samples between t1 and t2, and Z is a number between 1 and NDATA indicating estimated location.

6. The method of claim 1, wherein the step of converting includes calculating an inverse discrete Fourier transform to generate the plurality of time domain samples.

7. The method of claim 1, wherein the step of estimating comprises the steps of:
    identifying a time domain sample JMAX having a peak magnitude between t1 and t2;
    determining a slop in phase through the time domain sample JMAX, and
    if the slope is greater than a prespecified threshold, then determining a reference phase in the frequency domain, equal to the phase of a frequency domain sample near the center of the discontinuity, and finding the time domain sample Z, where the phase component matches the reference phase;
    if the slope is less than or equal to the prespecified threshold, then the time domain sample JMAX is defined as the time domain sample Z; and wherein the time domain sample Z is the estimate of the location of the selected discontinuity.

8. The method of claim 7, wherein the first step of correcting is a heterodyne function in the time domain equivalent to a shift of the center of the discontinuity in the frequency domain to zero frequency, and the step of determining a reference phase includes the step of performing a discrete Fourier transform of the first corrected time domain samples to calculate a frequency domain sample for zero frequency, and wherein the phase of the frequency domain sample for zero frequency is the reference phase.

9. An apparatus for analyzing a network, comprising:
    measuring means, coupled to the network for measuring a plurality of frequency domain samples of a signal generated by the network in response to excitation signals at frequencies in a range from f1 to f2;
    converting means, coupled to the measuring means, for converting the plurality of frequency domain samples to a plurality of time domain samples within a range from t1 to t2, wherein a selected discontinuity is located between t1 and t2;
    first correcting means, coupled to the converting means, for correcting phase errors in the plurality of time domain samples independent of location of the selected discontinuity;
    means, coupled to the measuring means and the first correcting means, for estimating the location of the selected discontinuity in the first corrected plurality of time domain samples;
    second correcting means, coupled to the means for estimating and the first correcting means, for correcting phase errors in the time domain samples closest to the estimated location to generate resulting data; and
    means, coupled to the second correcting means, for displaying the resulting data.

10. The apparatus of claim 9, wherein the converting means, first correcting means, estimating means, and second correcting means are implemented by software control of a data processing unit.

11. The apparatus of claim 9, wherein the converting means includes means for calculating a inverse chirp Z-transform to generate the plurality of time domain samples.

12. The apparatus of claim 9, wherein the first correcting means includes means for shifting the plurality of time domain samples in phase by an amount V given by $$V = -pi*(t2-t1)*(f2-f1)*(j-0.5)/NDATA;$$

where NDATA is the number of samples in the plurality of time domain samples between t1 and t2.

13. The apparatus of claim 9, wherein the second correcting means includes means for shifting the time domain sample closest to the estimated location in phase by an amount U given by $$U = pi*((Z-1)*(t2*f1+t2*f2-t1*f1-t1*f2)/(-NDATA-1)+2*t1*f1);$$

where NDATA is the number of samples in the plurality of time domain samples between t1 and t2.

14. The apparatus of claim 9, wherein the converting means includes means for calculating an inverse discrete Fourier transform to generate the plurality of time domain samples.

15. The apparatus of claim 9, wherein the estimating means comprises:
   means for identifying a time domain sample JMAX having a peak magnitude between t1 and t2;
   means for determining a slope in phase through the time domain sample JMAX, and
   means, operative if the slope is greater than a prespecified threshold, for determining a reference phase in the frequency domain, equal to the phase of a frequency domain sample near the center of the discontinuity, and finding the time domain sample Z, where the phase component matches the reference phase; and wherein
   if the slope is less than or equal to the prespecified threshold, then the time domain sample JMAX is defined as the time domain sample Z; and wherein the time domain sample Z is the estimate of the location of the selected discontinuity.

16. The apparatus of claim 15, wherein the first correcting means performs a heterodyne function in the time domain equivalent to a shift of the center of the discontinuity in the frequency domain to zero frequency, and estimating means includes means for determining a reference phase by performing a discrete Fourier transform of the first corrected time domain samples to calculate a frequency domain sample for zero frequency, and wherein the phase of the frequency domain sample for zero frequency is the reference phase.

17. For use with a network analyzer that gathers a sequence of NDATA samples, each sample including real and imaginary components of a signal, over a frequency range from f1 to f2 in frequency steps of (f2−f1)/(NDATA−1), where f1 is greater than zero, a method for processing the sequence of samples to estimate a characteristic of the signal with respect to a selected discontinuity; comprising the steps of:
   converting the sequence of samples to time domain, to generate a sequence of NDATA time domain samples, each time domain sample including a magnitude and a phase component, in a time range of t1 to t2, where the selected discontinuity is located within the time range;
   unwinding the time domain samples to correct a portion of phase error in the time domain independent of location of the discontinuity in the time domain;
   finding a time domain sample JMAX having a magnitude peak within the time range;
   finding a slope in the phase component of the time domain samples through the time domain sample JMAX;
   if the slope is greater than a prespecified threshold, then determining a reference phase in the frequency domain, equal to the phase of data sample near the center of the discontinuity, and finding the time domain sample Z, where the phase component matches the reference phase and Z is an integer if the slope is less than the prespecified threshold, then the time domain sample JMAX is defined as the time domain sample Z;
   unwrapping the phase component of the time domain sample Z as a function of Z to determine an estimate of correct phase of the time domain sample Z.

18. The method of claim 17, wherein the step of converting includes calculating the inverse chirp Z-transform.

19. The method of claim 17, wherein the step of unwinding includes shifting the NDATA samples in phase by an amount V given by $$V = -pi*(t2-t1)*(f2-f1)*(J-0.5)/NDATA.$$

20. The method of claim 17, wherein the step of unwrapping includes shifting the sample Z in phase by an amount U given by $$U = pi*((Z-1)*(t2*f1+t2*f2-t1*f1-t1*f2)/(-NDATA-1)+2*t1*f1).$$

21. The method of claim 17, wherein the signal is generated by an electronic network in response to excitation signals at the frequencies of corresponding data samples.

22. For use with a network analyzer that gathers a sequence of NDATA samples, each sample including real and imaginary components of a signal, over a frequency range from f1 to f2 in frequency steps of (f2−f1)/(NDATA−1), where f1 is greater than zero, a method for processing the sequence of samples to estimate a characteristic of the signal with respect to a selected discontinuity; comprising the steps of:
   performing an inverse Fourier transform to convert the sequence of samples to time domain with an unaliased time range 0 to t, to generate a sequence of NDATA time domain samples, each time domain sample including magnitude and a phase component, in a time range of t1 to t2, where the selected discontinuity is located within the time range;
   performing a complex multiplication of the time domain samples, $T_J$, for J equal to 1 through NDATA, by a unit vector V, where the phase of V is given by $$V = -pi*(t2-t1)*(f2-f1)*(J-0.5)/NDATA.$$

finding a time domain sample JMAX having a magnitude peak within the time range;
   finding a slope in the phase component of the time domain samples through the time domain sample JMAX;
   if the slope is greater than a prespecified threshold, then determining a reference phase in the frequency domain, equal to the phase of a frequency domain sample near the center of the discontinuity, and finding the time domain sample Z, where the phase component matches the reference phase and Z is an integer between 1 and NDATA;
   if the slope is less than or equal to the prespecified threshold, then the time domain sample JMAX is defined as the time domain sample Z;
   performing a complex multiplication of the time domain sample Z by the unit vector U, where the phase of U is given by $$U = pi*(Z-1)*(t2*f1+t2*f2*f2-t1*f1-t1*f2)/(-NDATA-1)+2*t1*f1);$$

and displaying resulting data.

* * * * *

UNITED STATES PATENT AND TRADEMARK OFFICE
CERTIFICATE OF CORRECTION

PATENT NO. : 4,995,006
DATED : February 19, 1991
INVENTOR(S) : Robert G. Huenemann, Frederick J. Harris Page 1 of 7

It is certified that error appears in the above-identified patent and that said Letters Patent is hereby corrected as shown below:

Column 6, line 36, change "x2 x2" to --x2 x3--.
Column 3, after line 50, insert "Appendix 1 shows a Fortran software source code implementation of a preferred embodiment of the invention."

In the Claims:

Claim 1, column 9, line 26, change "closet" to --closest--.
Claim 4, column 9, line 41, change "apparatus" to --method--.
Claim 4, column 9, line 45, change "(j-0.5)" to --(J-0.5)--.
Claim 5, column 9, line 49, change "apparatus" to --method--.
Claim 5, column 9, line 54, change "pi*(" to --pi*((--.
Claim 12, column 10, line 63, change "(j-0.5)" to --(J-0.5)--.
Claim 17, column 11, line 68, after "Z is an integer" insert --between 1 and NDATA;--.
Claim 22, column 12, line 29, change "(NDATA)-1)" to --(NDATA-1)--.
Claim 22, column 12, line 64, change "pi*(" to --pi*((--.
Claim 22, column 12, line 64, change "t2*f2*f2" to --t2*f2--.

Signed and Sealed this

Sixth Day of December, 1994

*Attest:*

BRUCE LEHMAN

*Attesting Officer*          *Commissioner of Patents and Trademarks*

SOFTWARE APPENDIX

Copyright WILTRON 1988

37 C.F.R. §1.96(a)(2)(ii)

WILT-6340-8MCF/MAH
60/SJW33    032488

```
      program mar17
c     rgh interface to subroutine viewdata[c,alias:'viewdata'](nview)
      integer[c] nview
      end common /ibglob/ ibsta, iberr, ibcnt
      common /ibglob/ cmd, rd, wrt
      common /ibglob/ bname, bdname
      common /ibglob/ flname
      common /ibglob/ bd, pltr, v, cnt, mask
      common /ibglob/ spr, ppr
      common /ibglob/ realx, realy, xoffset,yoffset
      common /ibglob/ x,y,pi,n,imagph
      common /ibglob/ size integer*2       ibsta, iberr, ibcnt
      integer*2       cmd(10),rd(512),wrt(512)
      character*8     bname,bdname
      character*50    flname
      integer*2       bd,pltr,v,cnt,mask
      integer*2       spr,ppr
      real*4          realx,realy,xoffset,yoffset
      real*4          x(2048),y(2048),pi
      integer*4       n,imagph
      real*4          size real*4          wtr(2048),wti(2048)

integer[c]      nview
      real*8          doublepi,doublz c Initialize variables doublepi=atan2(0.0,-1.0)

c Enter parameters write(*,*)'Make all lower case entries in integer format' write(*,*)'Enter number of data points to use'
      read(*,*)ndata
      nview=ndata write(*,*)'Enter START FREQUENCY'
      read(*,*)f1 write(*,*)'Enter END FREQUENCY'
      read(*,*)f2 gain=1.0
      nterms=1
      write(*,*)'Enter 0 (no) or 1 (yes) for Hamming window'
      read(*,*)iwindow
```

```
             iwindow=0
             if (iwindow) 1316,1317,1316
    1316     gain=25.0/46.0
             nterms=2
    1317     continue write(*,*)'Enter START TIME'
             read(*,*)t1 write(*,*)'Enter END TIME'
             read(*,*)t2 write(*,*)'Enter POSITION OF DISCONTINUITY'
             read(*,*)position c fill arrays with zeroes 2000     do 2020 j=1,ndata
             x(j)=0.0
             y(j)=0.0
    2020     continue c create data do 2310 j=1,ndata
             doublz=2*doublepi*position*(f1+(f2-f1)*(j-1)/(ndata-1))
             x(j)=+cos(doublz)
             y(j)=-sin(doublz)
    2310     CONTINUE 2320     continue c compute window do 2660 j=1,ndata
             doublz=2.0*doublepi*(float(j-1)-float(ndata)/2.0+0.5)/float(ndar
             b=cos(doublz)
             c=cos(2*doublz)
             z=gain+(1.0-gain)*b+0.00000*c
             x(j)=z*x(j)
             y(j)=z*y(j)
    2660     continue call viewdata(nview)

c Convert to time domain (inverse transform)

c compute time parameters zoomoff=(f2-f1)*(t1+(t2+t1)/(2*ndata-2))
             zoomport=(t2-t1)*(f2-f1)/(ndata-1)

DLTOMG=-zoomport
             OME0=-zoomoff
```

```
              call czt(x,y,ndata,ndata,0.0,DLTOMG,wtr,wti,
     *   0.0,OME0,0,1008,float(ndata))

z=1.0/(gain*ndata)
              do 3250 j=1,ndata
              x(j)=x(j)*z
              y(j)=y(j)*z
 3250         continue call viewdata(nview)

c do low pass equivalent processing c unwind time domain data do 3365 j=1,ndata
              doublz=-doublepi*(t2-t1)*(f2-f1)*(j-0.5)/float(ndata)
              tempx=x(j)*cos(doublz)-y(j)*sin(doublz)
              tempy=x(j)*sin(doublz)+y(j)*cos(doublz)
              x(j)=tempx
              y(j)=tempy
 3365         continue call viewdata(nview)

c    find bin number of maximum value 3405         z2=0
              do 3415 j=1,ndata
              z1=x(j)*x(j)+y(j)*y(j)
              if (z1-z2) 3415,3415,3410
 3410         z2=z1
              jmax=j
 3415         continue zmax=jmax i=nterms*(ndata-1)/(2*(t2-t1)*(f2-f1))
              jlower=max(1,jmax-i)
              jupper=min(jmax+i,ndata)
              do 3422 j=jlower,jupper
 3422         continue c compute phase slope j=jlower
              call polar(x(j),y(j),z,z1)
              j=jupper
              call polar(x(j),y(j),z,z2)
              z3=abs(z1-z2)
c allow for difference of 2*pi
              if (z3-doublepi) 3424,3424,3423
 3423         z3=2.0*doublepi-z3

3424         slopeof0=abs(z3)
```

```
c make location decision in degrees
        if(180.0*slopeof0/doublepi-0.3) 4432,4432,3425

3425    continue c recover center0 phase with dft
        x0=0
        y0=0
        do 3440 j=1,ndata
        x0=x0+x(j)
        y0=y0+y(j)
3440    continue
        call polar(x0,y0,radius,center0)

c find center by phase interpolation c find sign change when phase crosses center phase value
        j=jlower
        z2=atan2(y(j),x(j))
        z2=z2-center0 c put z2 into range of +/- pi
        if (z2-doublepi)3501,3501,3500
3500    z2=z2-2.0*doublepi
3501    if (z2+doublepi)3502,3503,3503
3502    z2=z2+2.0*doublepi 3503    do 4430 j=jlower+1,jupper c store last value
        z1=z2
        z2=atan2(y(j),x(j))
        z2=z2-center0 c put z2 into range of +/- pi
        if (z2-doublepi)3601,3601,3600
3600    z2=z2-2.0*doublepi
3601    if (z2+doublepi)3602,3603,3603
3602    z2=z2+2.0*doublepi c test for sign change
3603    z=z1*z2
        if (z) 4431,4430,4430

4430    continue c       abnormal exit from loop -
```

```
c         do not interpolate if sign did not change
          goto 4432
c         exit from loop on sign change
4431      continue
c interpolate phase crossing
          zmax=j-z2/(z2-z1)
          i=j-1
4432      continue
c unwrap phase offset
          z=(zmax-1)/(ndata-1)
          time=t1+(t2-t1)*z
          z=doublepi*(z*(t2*f1+t2*f2-t1*f1-t1*f2)+2*t1*f1)
          sn=sin(z)
          cs=cos(z)
          do 4435 j=1,ndata
          z=x(j)*cs-y(j)*sn
          y(j)=x(j)*sn+y(j)*cs
          x(j)=z
4435      continue call viewdata(nview)
7480      stop
          end subroutine polar(x,y,radius,angle)
c this subroutine arbitrarily sets angle=0 if radius=0
          radius=sqrt(x*x+y*y)
          angle=0
          if (radius) 1000,4000,1000
1000      angle=atan2(y,x)
4000      return
          end
```

(annotation in left margin: "not part of" — bracketing the lines `time=t1+(t2-t1)*z` through `z=doublepi*...`)

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

Column 6, line 36, change "x2 x2" to --x2 x3--.
Column 3, after line 50, insert "Appendix 1 shows a Fortran software source code implementation of a preferred embodiment of the invention."
Column 9, after line 8, insert the following appendix:

SOFTWARE APPENDIX

Copyright WILTRON 1988

37 C.F.R. §1.96(a)(2)(ii)

```
program mar17
rgh interface to subroutine viewdata[c,alias:'viewdata'](nview)
integer[c] nview
end common /ibglob/ ibsta, iberr, ibcnt
common /ibglob/ cmd, rd, wrt
common /ibglob/ bname, bdname
common /ibglob/ flname
common /ibglob/ bd, pltr, v, cnt, mask
common /ibglob/ spr, ppr
common /ibglob/ realx, realy, xoffset,yoffset
common /ibglob/ x,y,pi,n,imagph
common /ibglob/ size
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
        integer*2       ibsta, iberr, ibcnt
        integer*2       cmd(10),rd(512),wrt(512)
        character*8     bname,bdname
        character*50    flname
        integer*2       bd,pltr,v,cnt,mask
        integer*2       spr,ppr
        real*4          realx,realy,xoffset,yoffset
        real*4          x(2048),y(2048),pi
        integer*4       n,imagph
        real*4          size real*4          wtr(2048),wti(2048)

integer[c]      nview
        real*8          doublepi,doublz c Initialize variables doublepi=atan2(0.0,-1.0)

c Enter parameters write(*,*)'Make all lower case entries in integer format' write(*,*)'Enter number of data points to use'
        read(*,*)ndata
        nview=ndata write(*,*)'Enter START FREQUENCY'
        read(*,*)f1
```

UNITED STATES PATENT AND TRADEMARK OFFICE
CERTIFICATE OF CORRECTION

PATENT NO. : 4,995,006                                         Page 3 of 10
DATED     : February 19, 1991
INVENTOR(S) : Robert G. Huenemann, Frederick J. Harris It is certified that error appears in the above-identified patent and that said Letters Patent is hereby corrected as shown below:

```
        write(*,*)'Enter END FREQUENCY'
        read(*,*)f2 gain=1.0
        nterms=1
        write(*,*)'Enter 0 (no) or 1 (yes) for Hamming window'
        read(*,*)iwindow iwindow=0
        if (iwindow) 1316,1317,1316
1316    gain=25.0/46.0
        nterms=2
1317    continue write(*,*)'Enter START TIME'
        read(*,*)t1 write(*,*)'Enter END TIME'
        read(*,*)t2 write(*,*)'Enter POSITION OF DISCONTINUITY'
        read(*,*)position c fill arrays with zeroes 2000    do 2020 j=1,ndata
        x(j)=0.0
        y(j)=0.0
2020    continue
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
c create data do 2310 j=1,ndata
      doublz=2*doublepi*position*(f1+(f2-f1)*(j-1)/(ndata-1))
      x(j)=+cos(doublz)
      y(j)=-sin(doublz)
2310  CONTINUE 2320  continue c compute window do 2660 j=1, ndata
doublz-2.0*doublepi*(float(j-1)-float(ndata)/2.0+0.5)/float(ndata)
b=cos(doublz)
c=cos(2*doublz)
z=gain+(1.0-gain)*b+0.00000*c
x(j)=z*x(j)
y(j)=z*y(j)
2660  continue call viewdata(nview)

c Convert to time domain (inverse transform)

c compute time parameters zoomoff=(f2-f1)*(t1+(t2+t1)/(2*ndata-2))
      zoomport=(t2-t1)*(f2-f1)/(ndata-1)

DLTOMG=-zoomport
      OME0=-zoomoff
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
      call czt(x,y,ndata,ndata,0.0,DLTOMG,wtr,wti,
   * 0.0,OME0,0,1008,float(ndata))

z=1.0/(gain*ndata)
      do 3250 j=1,ndata
      x(j)=x(j)*z
      y(j)=y(j)*z
3250  continue call viewdata(nview)

c do low pass equivalent processing c unwind time domain data do 3365 j=1,ndata
      doublz=-doublepi*(t2-t1)*(f2-f1)*(j-0.5)/float(ndata)
      tempx=x(j)*cos(doublz)-y(j)*sin(doublz)
      tempy=x(j)*sin(doublz)+y(j)*cos(doublz)
      x(j)=tempx
      y(j)=tempy
3365  continue call viewdata(nview)

c   find bin number of maximum value 3405  z2=0
      do 3415 j=1,ndata
      z1=x(j)*x(j)+y(j)*y(j)
      if (z1-z2) 3415,3415,3410
```

UNITED STATES PATENT AND TRADEMARK OFFICE
CERTIFICATE OF CORRECTION

PATENT NO. : 4,995,006
DATED : February 19, 1991
INVENTOR(S) : Robert G. Huenemann, Frederick J. Harris It is certified that error appears in the above-identified patent and that said Letters Patent is hereby corrected as shown below:

```
3410       z2=z1
           jmax=j
3415       continue zmax=jmax i=nterms*(ndata-1)/(2*(t2-t1)*(f2-f1))
           jlower=max(1,jmax-i)
           jupper=min(jmax+i,ndata)
           do 3422 j=jlower,jupper
3422       continue c compute phase slope j=jlower
           call polar(x(j),y(j),z,z1)
           j=jupper
           call polar(x(j),y(j),z,z2)
           z3=abs(z1-z2)
c allow for difference of 2*pi
           if (z3-doublepi) 3424,3424,3423
3423       z3=2.0*doublepi-z3

3424       slopeof0=abs(z3)

c make location decision in degrees if(180.0*slopeof0/doublepi-0.3) 4432,4432,3425

3425       continue c recover center0 phase with dft
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
            x0=0
            y0=0
            do 3440 j=1,ndata
            x0=x0+x(j)
            y0=y0+y(j)
3440        continue
            call polar(x0,y0,radius,center0)

c find center by phase interpolation c   find sign change when phase crosses center phase value j=jlower
            z2=atan2(y(j),x(j))
            z2=z2-center0 c   put z2 into range of +/- pi if (z2-doublepi)3501,3501,3500
3500        z2=z2-2.0*doublepi
3501        if (z2+doublepi)3502,3503,3503
3502        z2=z2+2.0*doublepi 3503        do 4430 j=jlower+1,jupper c   store last value z1=z2
            z2=atan2(y(j),x(j))
            z2=z2-center0 c   put z2 into range of +/- pi
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
            if (z2-doublepi)3601,3601,3600
3600        z2=z2-2.0*doublepi
3601        if (z2+doublepi)3602,3603,3603
3602        z2=z2+2.0*doublepi
c test for sign change
3603        z=z1*z2
            if (z) 4431,4430,4430

4430        continue
c           abnormal exit from loop -
c           do not interpolate if sign did not change
            goto 4432
c           exit from loop on sign change
4431        continue
c interpolate phase crossing
            zmax=j-z2/(z2-z1)
            i=j-1
4432        continue
c unwrap phase offset
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
            z=(zmax-1)/(ndata-1)
            time=t1+(t2-t1)*z
            z=doublepi*(z*(t2*f1+t2*f2-t1*f1-t1*f2)+2*t1*f1)
            sn=sin(z)
            cs=cos(z)
            do 4435 j=1,ndata
            z=x(j)*cs-y(j)*sn
            y(j)=x(j)*sn+y(j)*cs
            x(j)=z
4435        continue call viewdata(nview)

7480        stop
            end subroutine polar(x,y,radius,angle)

c this subroutine arbitrarily sets angle=0 if radius=0 radius=sqrt(x*x+y*y)
            angle=0
            if (radius) 1000,4000,1000
1000        angle=atan2(y,x)
4000        return
            end
```

UNITED STATES PATENT AND TRADEMARK OFFICE
CERTIFICATE OF CORRECTION

PATENT NO. : 4,995,006

DATED : February 19, 1991

INVENTOR(S) : Robert G. Huenemann, Frederick J. Harris

It is certified that error appears in the above-identified patent and that said Letters Patent is hereby corrected as shown below:

```
Claim 1, column 9, line 26, change "closet" to --closest--.
Claim 4, column 9, line 41, change "apparatus" to --method--.
Claim 4, column 9, line 45, change "(j-0.5)" to --(J-0.5)--.
Claim 5, column 9, line 49, change "apparatus" to --method--.
Claim 5, column 9, line 54, change "pi*(" to --pi*((--.
Claim 12, column 10, line 63, change "(j-0.5)" to --(J-0.5)--.
Claim 17, column 11, line 68, after "Z is an integer" insert
                               --between 1 and NDATA;--.
Claim 22, column 12, line 29, change "(NDATA)-1)" to
                               --(NDATA-1)--.
Claim 22, column 12, line 64, change "pi*(" to --pi*((--.
Claim 22, column 12, line 64, change "t2*f2*f2" to --t2*f2--.
```

Signed and Sealed this

Twenty-sixth Day of September, 1995

Attest:

*Attesting Officer*

BRUCE LEHMAN

*Commissioner of Patents and Trademarks*